(12) United States Patent
Das et al.

(10) Patent No.: US 11,747,405 B2
(45) Date of Patent: Sep. 5, 2023

(54) SYSTEM AND METHOD FOR AUDIO AND VIBRATION BASED POWER DISTRIBUTION EQUIPMENT CONDITION MONITORING

(71) Applicant: Robert Bosch GmbH, Stuttgart (DE)

(72) Inventors: Samarjit Das, Sewickley, PA (US); Joseph Szurley, Upper Saint Clair, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/976,469

(22) PCT Filed: Feb. 26, 2019

(86) PCT No.: PCT/EP2019/054659
§ 371 (c)(1),
(2) Date: Aug. 27, 2020

(87) PCT Pub. No.: WO2019/166396
PCT Pub. Date: Sep. 6, 2019

(65) Prior Publication Data
US 2021/0048488 A1  Feb. 18, 2021

Related U.S. Application Data

(60) Provisional application No. 62/636,470, filed on Feb. 28, 2018.

(51) Int. Cl.
*G01R 31/62* (2020.01)
*H02J 13/00* (2006.01)
*G06N 3/08* (2023.01)

(52) U.S. Cl.
CPC ............ *G01R 31/62* (2020.01); *G06N 3/08* (2013.01); *H02J 13/00002* (2020.01)

(58) Field of Classification Search
CPC ............ G01R 31/06; G01R 31/0445; G01R 31/04542; G01R 31/1209; G01R 31/2846; G06N 3/08; H02J 13/00; H02J 13/00002
See application file for complete search history.

(56) References Cited

U.S. PATENT DOCUMENTS 9,892,744 B1 * 2/2018 Salonidis ................ G10L 25/51
2002/0091491 A1  7/2002 Jackson et al.
(Continued)

FOREIGN PATENT DOCUMENTS

JP    2019049778 A  * 3/2019
WO   2018/081368 A1   5/2018

OTHER PUBLICATIONS

E. Marchi and et al, "Deep Recurrent Neural Network-Based Autoencoders for Acoustic Novelty Detection", Computational Intelligence and Neuroscience vol. 2017, Article ID 4694860, 14 pages (Year: 2017).*

(Continued)

*Primary Examiner* — Douglas Kay
(74) *Attorney, Agent, or Firm* — Maginot, Moore & Beck LLP

(57) ABSTRACT

An audio and vibration based power distribution equipment condition monitoring system and method is provided. The system includes an intelligent audio analytic (IAA) device and a sensing assembly. The IAA device has computer executable instructions such as an audio data processing algorithms configured to identify and predict impending anomalies associated with one or more power distribution equipment using one or more neural networks.

17 Claims, 6 Drawing Sheets

(56) References Cited

U.S. PATENT DOCUMENTS

| | | | |
|---|---|---|---|
| 2013/0030765 A1* | 1/2013 | David | G05B 23/024 |
| | | | 702/183 |
| 2013/0173178 A1 | 7/2013 | Poczka et al. | |
| 2016/0282872 A1 | 9/2016 | Ahmed et al. | |
| 2019/0123931 A1* | 4/2019 | Schuster | G05B 13/0265 |
| 2020/0371491 A1* | 11/2020 | Wong | G05B 13/04 |

OTHER PUBLICATIONS

International Search Report corresponding to PCT Application No. PCT/EP2019/054659, dated May 9, 2019 (4 pages).

* cited by examiner

SYSTEM AND METHOD FOR AUDIO AND VIBRATION BASED POWER DISTRIBUTION EQUIPMENT CONDITION MONITORING

CROSS-REFERENCE TO RELATED APPLICATIONS

This application is a 35 U.S.C. § 371 National Stage Application of PCT/EP2019/054659, filed on Feb. 26, 2019, which claims priority to U.S. Provisional Application Serial No. 62/636,470 on Feb. 28, 2018, the disclosures of which are incorporated herein by reference in their entirety.

TECHNICAL FIELD

This disclosure relates generally to equipment health monitoring system and, more particularly, to audio and vibration based power distribution equipment condition monitoring systems and methods.

BACKGROUND

Unless otherwise indicated herein, the materials described in this section are not prior art to the claims in this application and are not admitted to the prior art by inclusion in this section.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to audio and vibration based power distribution equipment condition monitoring systems and methods. The system comprises of an IAA device and a sensing assembly. The IAA device having computer executable instructions such as an audio data processing algorithms is configured to identify and predict impending anomalies associated with one or more power distribution equipment.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein.

DETAILED DESCRIPTION

Figure 1:
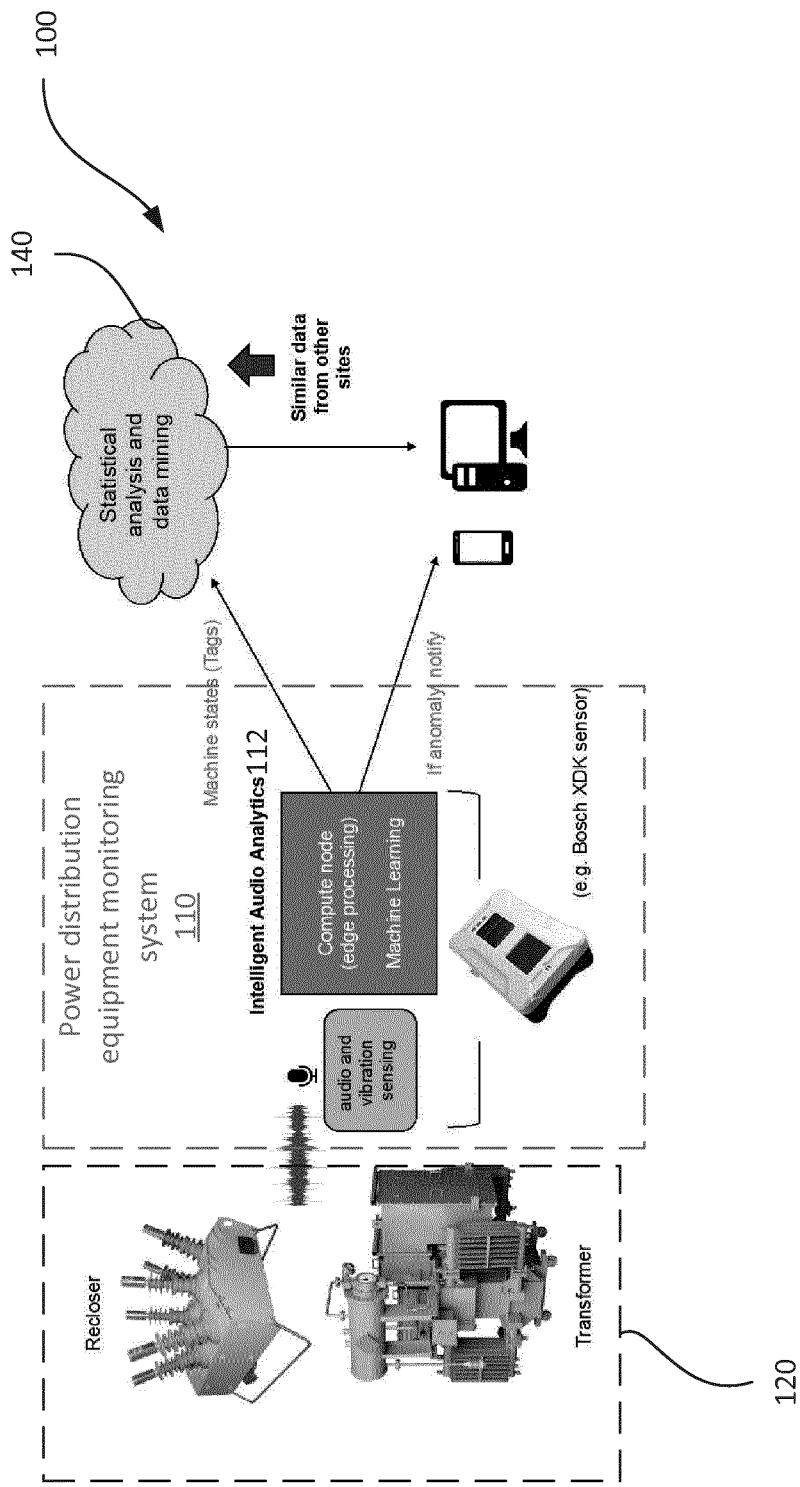
FIG. 1 is a simplified block diagram of an audio and vibration based power distribution equipment condition monitoring system according to a described embodiment of a disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

FIG. 1 is a simplified block diagram of an audio and vibration based power distribution equipment condition monitoring system 110 in exemplary network environment 100 according to a described embodiment of a disclosure. The system 110 comprises an intelligent audio analytic (IAA) device 112 including an audio data processing algorithms programmed into the IAA device 112 and is configured to identify and predict impending anomalies associated with any suitable power distribution equipment 120. The power distribution equipment 120 may include transformers, regulators, chillers, recloser, and so forth. Depending on the scale of a facility, any suitable number of power distribution equipment 120 may be installed in the exemplary network environment. The function performed by the IAA device 112 allows for both erroneous machine operation and deteriorating machine health or condition to be categorized facilitating preventive or corrective measures thereby reducing maintenance costs and limiting the downtime of the system. The IAA device module 112 analyzes the temporal dynamics in the audio/vibration data and utilizes state-of-the-art machine learning algorithms for time-series anomaly detection and prediction.

Figure 2:
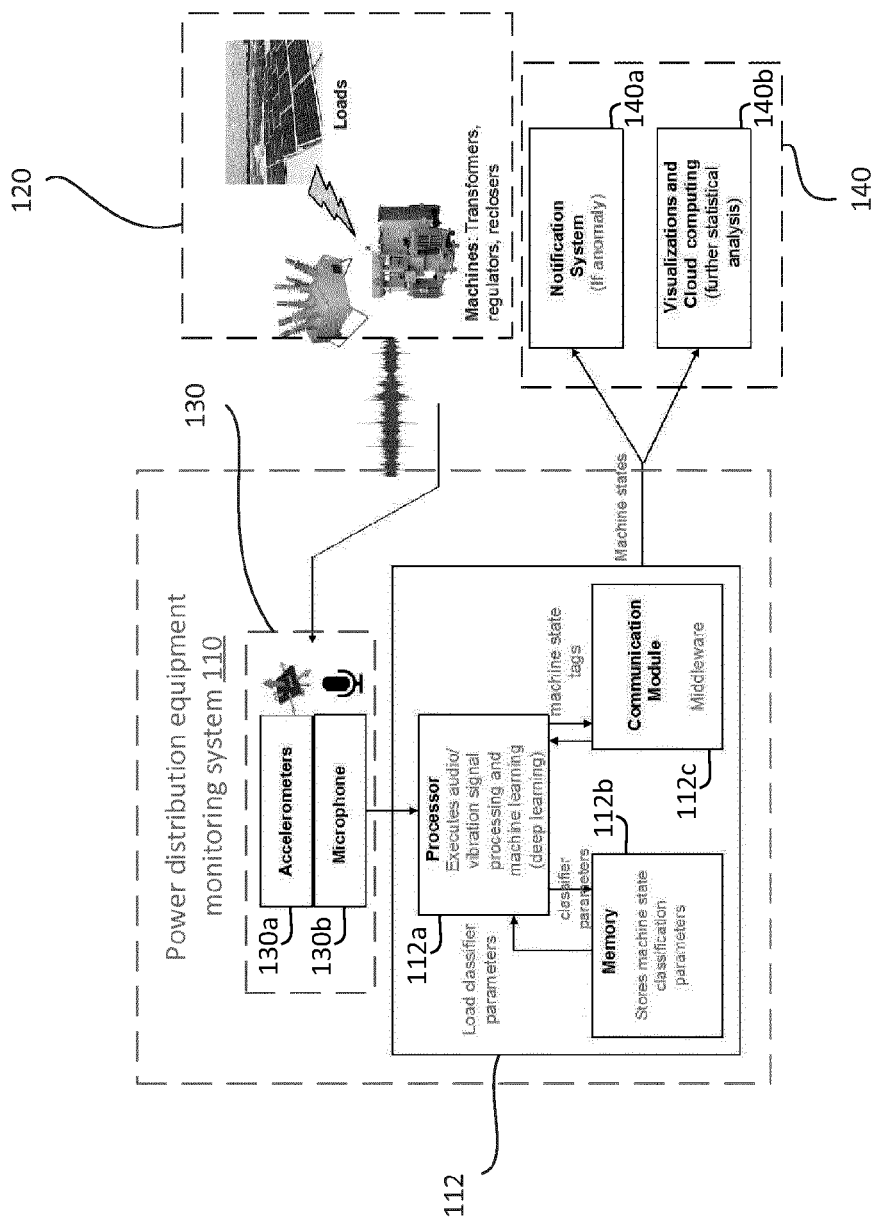
FIG. 2 is a simplified block diagram of an intelligent audio and vibration analytics system according to a described embodiment of the disclosure.

FIG. 2 is a simplified block diagram of an intelligent audio and vibration analytics system 112 or "IAA device module" defined herein according to a described embodiment of the disclosure. The IAA device module 112 may be either incorporated into the power distribution equipment monitoring system 110 or may be a separate module independent from the power distribution equipment monitoring system and is communicatively coupled to the power distribution equipment monitoring system 110. In FIG. 2, the IAA device 112 is communicatively coupled to a sensing assembly 130. In one embodiment, the sensing assembly may include a vibration sensor, an accelerometer, an audio input, a motion sensor, or any suitable sensing units. As illustrated, an accelerometer 130a and a microphone 130b are included in the sensing assembly 130. In order to collect training data for the machine learning algorithms, the sensing assembly is mounted on or in the vicinity of the power distribution 120 under test (DUT). The sensing assembly 120 detects the signals and the detected signals is then preprocessed to remove any competing environmental or ambient noise, such as passing vehicle, roadwork, and so forth. In one embodiment, the preprocessing function can be performed by the sensing assembly 120. In some embodiments, the preprocessing function can be performed by a preprocessor either disposed in the sensing assembly 130 to form part of the sensing assembly or located outside the sensing assembly 130 and is communicatively coupled to the sensing assembly 130. If the preprocessor is located outside the sensing assembly 130, the preprocessor can be carried by the IAA device 112 to form a portion of the IAA device 112. Alternatively, the preprocessor can be an independent computer module. The sensing assembly 130 not only is capable of capturing audio signal using the audio input 130b, the sensing assembly 130 is also capable of capturing vibration signal using the vibration sensor. Once the audio and/or vibration signal is captured, the IAA device 112 estimates operating states of the power distribution equipment 120 to determine if the equipment 120 is normal and anomalous. The capabilities to monitor/track operational state of a machine (say, a distribution transformer) reveal how an individual machine reacts to introduction of different types of loads e.g. solar arrays. Within the IAA device 112, a processor 112a, a memory 112b, and a communication module 112c are provided. Depending on the requirement of the applications, other computer modules such as user interfaces, or any suitable modules may be included in the IAA device 112. An audio analytics algorithm is installed in the processor 112a for execution, Further detailed description of the audio analytics algorithm will be provided below. The processor 112 receives the classification parameters for audio based machine state estimation from the memory 112b as well as real-time audio and/or vibration stream from the equipment 120 via the sensing assembly 130 and output the inferred machine states such as specific impact on operation state of the equipment 120 such as a transformer due to a specific load like solar array integration. The estimated machine states or anomalies are then passed on to the communication module 112c which in turn is transmitted to an external device for further statistical analysis.

Once the impact of load distribution/characteristics are traced for individual machines 120, the external device such as a cloud computing module 140 communicatively coupled to the IAA device 112 can further perform large-scale spatio-temporal analysis of load distribution impacts on the overall power distribution equipment condition monitoring system 110 by aggregating results from various locations including each instance and or location by utilizing an audio analytics based machine state monitoring algorithm. In some embodiments, the cloud computing module may be located in a cloud network. In another embodiment, the cloud computing module is also the cloud network. A visualization tool such as a program or an app may be installed on a computer machine with a display for displaying the state of the onging power distribution process or state of the overall power distribution infrastructure to a power distribution facility manager. The computer machine communicatively coupled to the cloud computing module may be a desktop computer, a portable computer, a laptop, a tablet, a wearable device, or any suitable computer machines. A notification system 140a such as a tool, a program, or an app is used to notify appropriate personnel such as a facility manager in case the IAA device 112 detects anomalous machines states in the power distribution equipment 120. The notification system 140a may be run on any suitable computer machines. The notification may be in the form a text message, an electronic mail, a voice mail, an audible sound, a display, an indicator, or any suitable forms of notification depending on the requirement of the application. In some embodiment, any of the notification system 140a, the visualizations tool, and the cloud computing module 140b may be run on either a single computer machine, multiple machines, a network, a server or combination thereof. In some embodiment, the notification system 140a, the visualizations tool, and the cloud computing module 140b may be installed in the same site, different site, or multiple sites.

Figure 3:
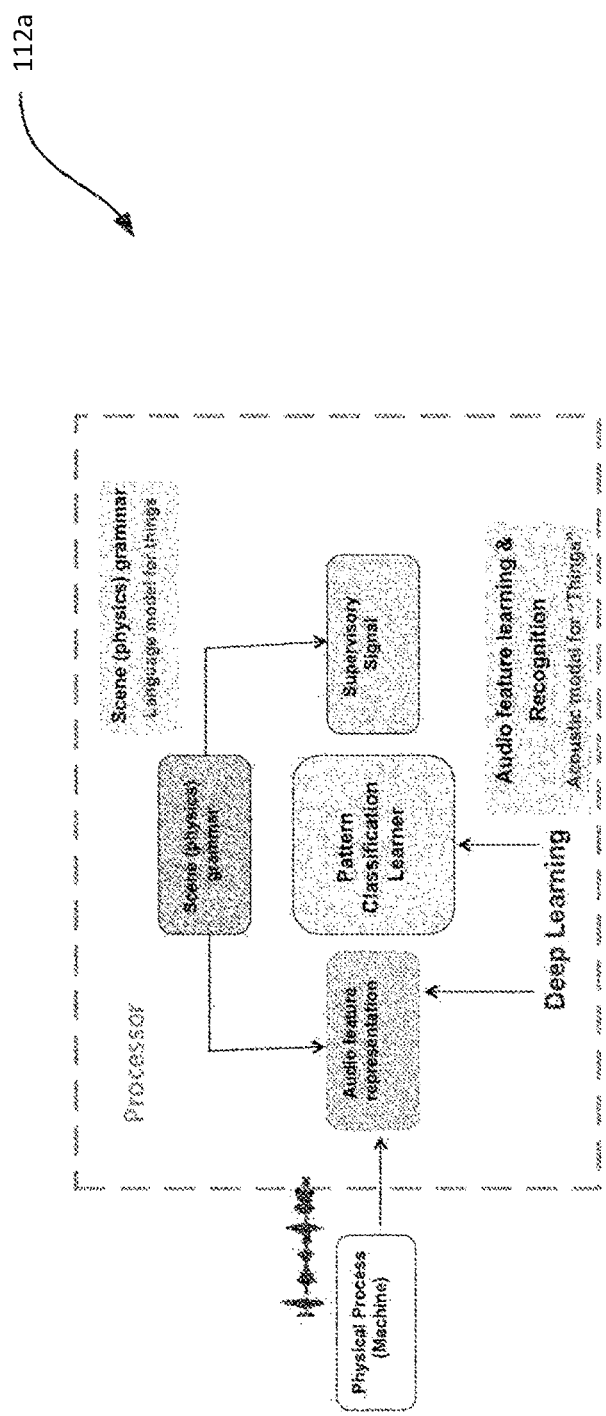
FIG. 3 is a simplified block diagram of an intelligent processor module according to a described embodiment of the disclosure.

FIG. 3 is a simplified block diagram of an intelligent processor module 112a according to a described embodiment of the disclosure. The intelligent processor module 112a, in one embodiment, is disposed in the IAA device 112 of FIG. 2. In some embodiments, the intelligent processor module 112a may be a separate and independent module and is communicatively coupled to the sensing assembly 130 and the IAA device 112. An audio analytics algorithm is installed and powered by the audio signal processing for audio feature representation and machine learning capabilities. The signal processing and machine learning algorithms behind the aforementioned audio analytics capabilities are largely agnostic to particular sensing modality and thus, can be adapted for any of the available time-series signals e.g., gyroscope, magnetometer, current, impedance and capacitance depending on application scenarios with power distribution systems. In fact, extending the algorithms to incorporate multimodal sensory fusion will enable deeper, perhaps hidden, dependencies and correlations to be exploited and thus improve upon the prediction and detection of anomalies. As depicted in the figure, the processor 112a includes several computer executable programs or functions such as scene grammar, pattern classification learner, supervisory signal, and audio feature representation. The processor 112a may also include deep learning, audio feature learning and recognition features or program. Depending on the requirement of the applications, other computer executable programs or instructions may be installed in and run by the processor 112a.

Figure 4:
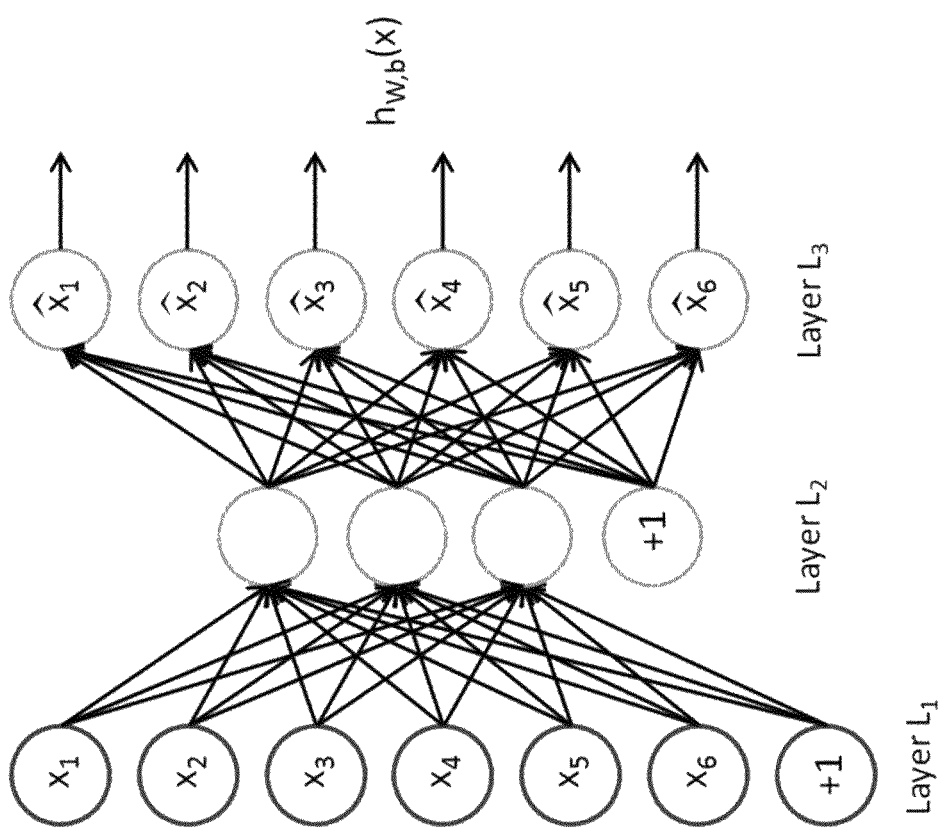
FIG. 4 is a simplified auto-encoder network architecture according to a described embodiment of the disclosure.

FIG. 4 is a simplified auto-encoder network architecture according to a described embodiment of the disclosure. For anomaly detection, an auto encoder (AE) and several of its derivatives such de-noising AE, deep AE, just to name a few can be used. The AE relies on a low dimensional latent representation of the signal subspace, which, when reconstructed and coupled with an error threshold, can differentiate between normal and anomalous data, i.e., anomalies tend to have larger reconstruction error. The aforementioned derivatives of the AE improve the performance of the standard AE by adding robustness and exploiting a deeper structure that may be present in the data. As depicted in the figure, a first layer L1 corresponds to the input signal (e.g. FFT of audio/vibration signals from the power distribution machines) and a third layer L3 is the reconstructed version of the signal. A second layer L2 is the low dimensional latent representation. The encoder can be trained with machine data wherein anomalous operations are assumed to be sparse over time. The reconstruction error at the third layer L3 will be large for those outlier signals. This error magnitude can be used as a cue for anomaly detection.

Figure 5:
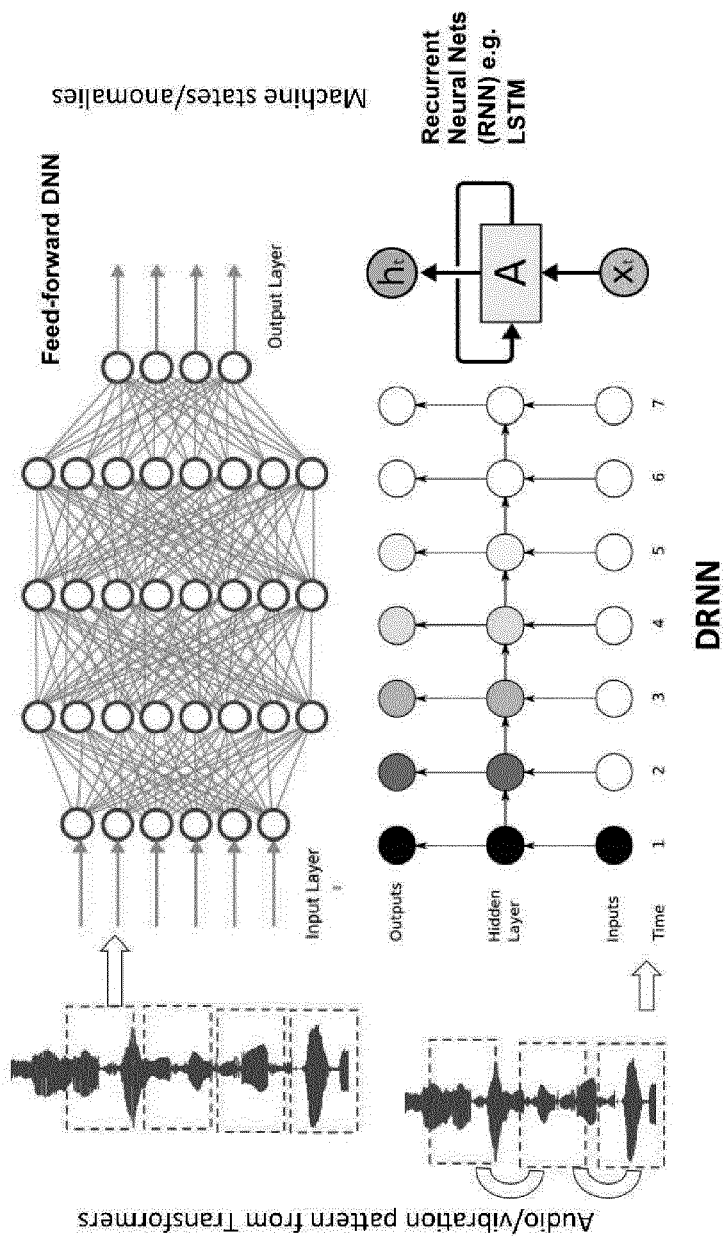
FIG. 5 is a diagram of a deep recurrent neural network (DRNN) that receives vectors of audio states according to a described embodiment of the disclosure.

FIG. 5 is a diagram of a deep recurrent neural network (DRNN) that receives vectors of audio states according to a described embodiment of the disclosure. Unlike from AE where only the frame, or instantaneous, difference between the current data and the known classifiers/anomalies are exploited. Further, AE does not retain any temporal information that may be used to predict the underlying structure that lead to the anomaly. To fully exploit temporal knowledge to assist as preventative maintenance, Deep Recurrent Neural Networks (DRNNs) is one of an approach to predict when possible anomalies will occur based on deep learning.

DRNN is capable of modeling the temporal dynamics of audio patterns as compared to frame-based approaches wherein each frame is associated with a label (e.g. normal vs. abnormal) without taking the temporal context/variations into account. However, training a DRNN on machine operation time series data involves annotation of the collected audio patterns into different operation modes beforehand. With those annotated data, DRNN can learn salient audio patterns associated normal power distribution operation as well as detect when it deviates into anomalies by identifying the failure modes (e.g. specific transformer unit malfunctioning). DRNN executed by the power distribution equipment condition monitoring system 110 not only shows remarkable ability to model audio signals associated with human speech, the power distribution equipment condition monitoring system 110 is also capable of performing monitoring and anomaly detection/prediction.

Figure 6:
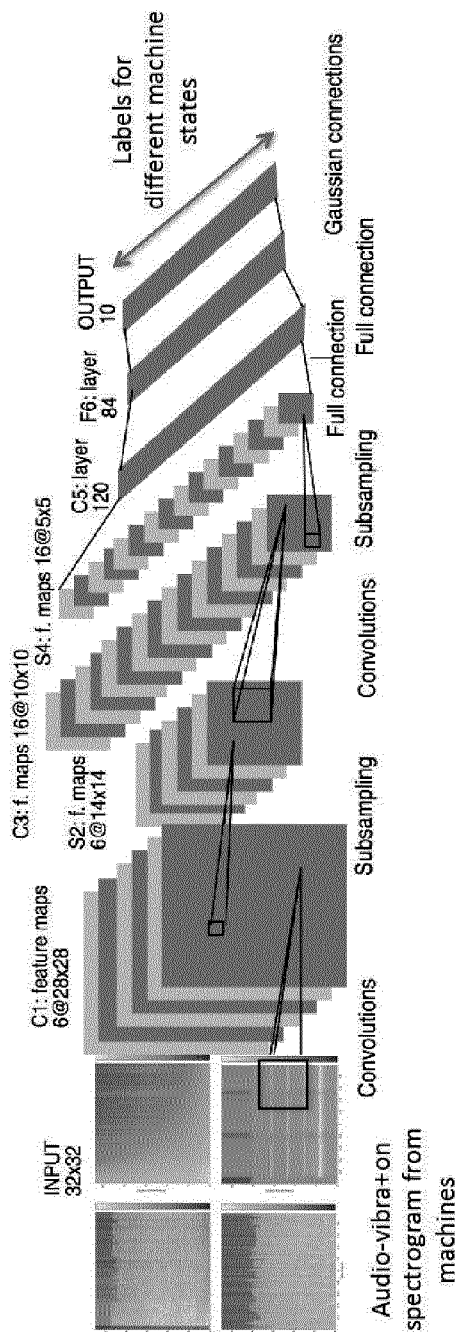
FIG. 6 is a diagram of a deep convolutional neural network (CNN) for continuous monitoring of machine operation states according to a described embodiment of the disclosure.

FIG. 6 is a diagram of a deep convolutional neural network (CNN) for continuous monitoring of machine operation states according to a described embodiment of the disclosure. The deep CNNs for continuous monitoring of machine operating states may be installed on the power distribution equipment condition monitoring system 110 to perform anomaly detection. The deep CNNs further facilitate statistical analysis in the cloud network for data mining and optimizing machine operations e.g. the long-term impact of loads like solar array integration into the power grid. The CNN based analysis applies to audio/vibrations associated with all the power distribution equipment like transformers, regulators and reclosers. In some embodiments, the CNNs can be used in a supervised learning framework. For example, first, time-stamped data can be collected for different machine states and the corresponding temporal audio-vibration segments can be transformed into spectrograms for further analysis. The spectrograms are henceforth be treated as natural 2D images and fed through a Visual Geometry Group (VGG) Network (very deep CNNs designed for image recognition) to recognize a particular machine state. An overview of the deep CNN architecture is provided in the figure that is executed by the power distribution equipment condition monitoring system 110.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the sprit and scope of this disclosure.

Embodiments within the scope of the disclosure may also include non-transitory computer-readable storage media or machine-readable medium for carrying or having computer-executable instructions or data structures stored thereon. Such non-transitory computer-readable storage media or machine-readable medium may be any available media that can be accessed by a general purpose or special purpose computer. By way of example, and not limitation, such non-transitory computer-readable storage media or machine-readable medium can comprise RAM, ROM, EEPROM, CD-ROM or other optical disk storage, magnetic disk storage or other magnetic storage devices, or any other medium which can be used to carry or store desired program code means in the form of computer-executable instructions or data structures. Combinations of the above should also be included within the scope of the non-transitory computer-readable storage media or machine-readable medium.

Embodiments may also be practiced in distributed computing environments where tasks are performed by local and remote processing devices that are linked (either by hardwired links, wireless links, or by a combination thereof) through a communications network.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, objects, components, and data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A power distribution equipment monitoring system comprising:

a plurality of sensing assemblies, each sensing assembly being configured for incorporation in, onto or proximate a respective power distribution equipment of a plurality of power distribution equipment arranged at various different locations, the plurality of power distribution equipment including at least one of a transformer, a regulator, a chiller, and a recloser, each of the plurality of sensing assemblies being configured to output respective sensor signals indicative of sounds and/or vibrations from the respective power distribution equipment; and an intelligent audio analytic (IAA) device configured to receive the sensor signals from the plurality of sensing assemblies, to process the sensor signals to detect anomalies from operation of the at least one power distribution equipment, and to output detection information to an output device to alert an operator of detection of any anomalies, the IAA including programmed instructions stored on a non-transitory computer readable storage medium and a processor configured to execute the programmed instructions, the programmed instructions including an analytics algorithm for execution by the processor to continuously process the sensor signals to detect the anomalies, wherein the analytics algorithm includes at least one neural network, an autoencoder neural network, the autoencoder neural network being configured to receive the respective sensor signals as input and to output respective reconstructed sensor signals based on the input, and wherein the processor is configured to (i) generate respective error signals that are indicative of a difference between the input and the output of the autoencoder neural network for the respective sensor signals, (ii) detect anomalies based on a magnitude of the respective error signal, and (iii) perform spatio-temporal analysis of load distribution impacts on the plurality of power distribution equipment by aggregating results from the plurality of power distribution equipment arranged at the various different locations.

2. The system of claim 1, wherein the sensor signals are preprocessed before being supplied as inputs to the autoencoder neural network.

3. The system of claim 2, wherein the processor is configured to compare the magnitude of the error signal with an error threshold and to detect anomalies when the magnitude of the error signal exceeds the error threshold.

4. The system of claim 2, wherein the autoencoder neural network comprises a deep recurrent neural network (DRNN), the DRNN being configured to receive the sensor signals as inputs and to detect audio and/or vibration patterns in the sensor signals indicative of the anomalies.

5. The system of claim 2, wherein the autoencoder neural network comprises a deep convolutional neural network (CNN), the CNN being configured to receive the sensor signals as inputs and to detect audio and/or vibration patterns in the sensor signals indicative of the anomalies.

6. The system of claim 5, wherein the sensor signals are transformed into spectrograms during preprocessing, the spectrograms being supplied as inputs to the deep CNN, and
wherein the deep CNN is configured to process the spectrograms to identify the anomalies.

7. A method for monitoring power distribution equipment, comprising:
generating respective sensor signals indicative of sounds and/or vibrations originating from a respective power distribution equipment of a plurality of power distribution equipment arranged at various different locations, the plurality of power distribution equipment including at least one of a transformer, a regulator, a chiller, and a recloser, the respective sensor signals being detected by a plurality of sensing assemblies located on, in or proximate the plurality power distribution equipment;
processing the respective sensor signals to detect anomalies from operation of the respective power distribution equipment using a processor of an intelligent audio analytic (IAA) device, the processor being configured to process the respective sensor signals according to an analytics algorithm to detect the anomalies, the analytics algorithm including an autoencoder neural network configured to detect errors and/or patterns in the respective sensor signals indicative of the anomalies; and
outputting detection information to an output device when an anomaly is detected,
wherein the autoencoder neural network is configured to receive the respective sensor signals as input and to output respective reconstructed sensor signals based on the input, and
wherein the processor is configured to (i) generate respective error signals that are indicative of a difference between the input and the output of the autoencoder neural network for the respective sensor signals, (ii) detect anomalies based on a magnitude of the respective error signal, and (iii) perform spatio-temporal analysis of load distribution impacts on the plurality of power distribution equipment by aggregating results from the plurality of power distribution equipment arranged at the various different locations.

8. The method of claim 7, wherein the sensor signals are preprocessed before being supplied as inputs to the autoencoder neural network.

9. The method of claim 8, wherein the processor is configured to compare the magnitude of the error signal with an error threshold and to detect anomalies when the magnitude of the error signal exceeds the error threshold.

10. The method of claim 8, wherein the autoencoder neural network comprises a deep recurrent neural network (DRNN), the DRNN being configured to receive the sensor signals as inputs and to detect audio and/or vibration patterns in the sensor signals indicative of the anomalies.

11. The method of claim 8, wherein the autoencoder neural network comprises a deep convolutional neural network (CNN), the CNN being configured to receive the sensor signals as inputs and to detect audio and/or vibration patterns in the sensor signals indicative of the anomalies.

12. The method of claim 11, wherein the sensor signals are transformed into spectrograms during preprocessing, the spectrograms being supplied as inputs to the deep CNN, and
wherein the deep CNN is configured to process the spectrograms to identify the anomalies.

13. A power distribution equipment system comprising:
a plurality of power distribution equipment arranged at various different locations, the plurality of power distribution equipment including at least one of a transformer, a regulator, a chiller, and a recloser;
a plurality of sensing assemblies, each sensing assembly being configured for incorporation in, onto or proximate a respective power distribution equipment of the plurality of power distribution equipment, the sensing assembly being configured to output respective sensor signals indicative of sounds and/or vibrations from the respective power distribution equipment;
an intelligent audio analytic (IAA) device configured to receive the sensor signals from the plurality of sensing assemblies, to process the sensor signals to detect anomalies from operation of the at least one power distribution equipment, and to output detection information to an output device to alert an operator of detection of any anomalies, the IAA including programmed instructions stored on a non-transitory computer readable storage medium and a processor configured to execute the programmed instructions, the programmed instructions including an analytics algorithm for execution by the processor to continuously process the sensor signals to detect the anomalies,
wherein the analytics algorithm includes at least one neural network, an autoencoder neural network, the autoencoder neural network being configured to receive the respective sensor signals as input and to output respective reconstructed sensor signals based on the input, and
wherein the processor is configured to (i) generate respective error signals that are indicative of a difference between the input and the output of the autoencoder neural network for the respective sensor signals, (ii) detect anomalies based on a magnitude of the respective error signal, and (iii) perform spatio-temporal analysis of load distribution impacts on the plurality of power distribution equipment by aggregating results from the plurality of power distribution equipment arranged at the various different locations.

14. The system of claim 13, wherein the processor is configured to compare the magnitude of the error signal with an error threshold and to detect anomalies when the magnitude of the error signal exceeds the error threshold.

15. The system of claim 13, wherein the autoencoder neural network comprises a deep recurrent neural network (DRNN), the DRNN being configured to receive the sensor signals as inputs and to detect audio and/or vibration patterns in the sensor signals indicative of the anomalies.

16. The system of claim 13, wherein the autoencoder neural network comprises a deep convolutional neural network (CNN), the CNN being configured to receive the sensor signals as inputs and to detect audio and/or vibration patterns in the sensor signals indicative of the anomalies.

17. The system of claim 13, wherein the sensor signals are transformed into spectrograms during preprocessing, the spectrograms being supplied as inputs to the deep CNN, and
wherein the deep CNN is configured to process the spectrograms to identify the anomalies.

* * * * *